Figure 1:
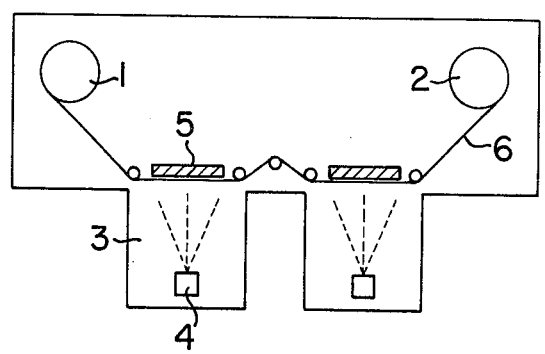

United States Patent [19]

Takagi et al.

[11] 4,091,138
[45] May 23, 1978

[54] INSULATING FILM, SHEET, OR PLATE MATERIAL WITH METALLIC COATING AND METHOD FOR MANUFACTURING SAME

[75] Inventors: Toshinori Takagi, Nagaokakyo-shi, Japan; Tatsuichiro Nishiyama; Unosuke Uchida, both of Yokohama, Japan

[73] Assignees: Sumitomo Bakelite Company Limited, Tokyo; Toshinori Takagi, Nagaokakyo, both of Japan

[21] Appl. No.: 655,233

[22] Filed: Feb. 4, 1976

[30] Foreign Application Priority Data

| Feb. 12, 1975 | Japan | 50-16816 |
|---|---|---|
| Feb. 12, 1975 | Japan | 50-16817 |
| Feb. 26, 1975 | Japan | 50-22767 |
| Feb. 26, 1975 | Japan | 50-22768 |
| Mar. 5, 1975 | Japan | 50-26077 |
| Mar. 6, 1975 | Japan | 50-26536 |
| Mar. 25, 1975 | Japan | 50-34933 |
| Mar. 28, 1975 | Japan | 50-36886 |

[51] Int. Cl.² ............................................. C23C 13/02
[52] U.S. Cl. ............................... 428/209; 428/458; 427/38; 427/81; 427/99; 427/124; 427/251; 427/162; 174/68.5; 204/192 C
[58] Field of Search ............ 427/13, 27, 250, 251, 427/99, 124, 89, 90, 91; 204/192 C, 192 SP; 174/68.5; 428/209, 458, 461, 457, 460

[56] References Cited

U.S. PATENT DOCUMENTS

| 2,590,557 | 3/1952 | Melsheimer | 427/251 X |
|---|---|---|---|
| 2,938,816 | 5/1960 | Gunther | 427/250 X |
| 3,043,728 | 7/1962 | Stauffer | 428/457 X |
| 3,117,022 | 1/1964 | Bronson et al. | 427/99 X |
| 3,210,214 | 10/1965 | Smith | 427/99 |
| 3,230,109 | 1/1966 | Domaleski | 427/91 X |
| 3,551,213 | 12/1970 | Boyle | 427/91 X |
| 3,573,098 | 3/1971 | Bieber et al. | 427/99 X |
| 3,634,159 | 1/1972 | Croskery | 427/99 X |
| 3,839,129 | 10/1974 | Neumann | 428/461 X |
| 3,968,270 | 7/1976 | Hasegawa | 427/13 |

FOREIGN PATENT DOCUMENTS

7,138,919  11/1971  Japan .................................... 423/13

*Primary Examiner*—Ralph S. Kendall
*Attorney, Agent, or Firm*—Karl W. Flocks

[57] ABSTRACT

This invention provides a method for forming a dense, electrically conductive, metallic coating having a sufficient adherence without use of an adhesive on an insulating film, sheet, or plate such as plastic film, plastic rigid sheet, or ceramics by the cluster ion plating procedure which comprises heating a crucible containing a vapor deposition metal at a temperature of 200° to 2,500° C in a vacuum of $1 \times 10^{-4}$ Torr. to $1 \times 10^{-7}$ Torr. to generate a metal cluster through a small hole of the crucible, ionizing the metal cluster by the impact of electrons, and electrostatically accelerating the resulting cluster ion and depositing the same on a base material; a method for directly forming an electric circuit on the base material without use of adhesive according to the above-said method, wherein the base material is covered with a mask in the sheet form; and a method for efficiently increasing the thickness of the metallic coatings formed by the above methods, by further deposition of a metal by a vacuum deposition procedure or by an ion plating procedure similar to the said cluster ion plating, except that the crucible has an ejecting hole of a larger diameter so that practically the cluster is no more formed. The invention also provides the products manufactured by the above methods.

11 Claims, 2 Drawing Figures

U. S. Patent May 23, 1978 4,091,138

INSULATING FILM, SHEET, OR PLATE MATERIAL WITH METALLIC COATING AND METHOD FOR MANUFACTURING SAME

This invention relates to an insulating film, sheet, or plate material having a metallic coating thereon obtained by forming on an insulating base material in the form of a film, sheet, or plate an electrically conductive metallic thin film having a high adherence to the base material without using an adhesive, and also relates to a method for manufacturing said film, sheet, or plate material having a metallic coating thereon.

The main object of this invention is to provide a method for manufacturing an insulating film, sheet, or plate overlaid with a metallic thin film having a high adherence to the base material, a good crystallinity, a flexiblity, an excellent gloss, and corrosion resistance.

Insulating film, sheet, or plate materials with thin metallic coating have conventionally been obtained by vacuum deposition or sputtering or plasma-type ion plating under an atmosphere of argon gas to form a thin metallic coating on the surface of the base material or by bonding a metal foil to the base material through an adhesive. However, when the thin metal coating is formed by vacuum deposition, the strength of bond between the metallic coating and the base material is low, and, hence, the uses thereof are limited. Furthermore, the crystallinity of the metallic coating is low, and hence, the electrical conductivity and corrosion resistance thereof are unsatisfactory. Sputtering is not suitable for plastic films and sheets, because the adherence of the resulting metallic coating to the base material is insufficient owing to small energy of vapor phase atoms of metal. Plasma-type ion plating is not suitable for plastic films and sheets because it causes a marked temperature rise of the base materials, and the adherence of the resulting metallic coating to the base material is insufficient. And in the case of sputtering the vapor deposition velocity is generally low. Therefore, the sputtering method is not useful in industry. The use of an adhesive results in a difficulty in handling thin metal foils, and hence, the bonding of a thin metal foil of about $5\mu$ or less in thickness is difficult, and rather impossible in industry. The adhesive remaining in the resulting composite are also unsatisfactory in folding endurance (the number of folds until the fracture of the foil at the folding line when the composite is repeatedly folded), electrical properties, particularly at high frequencies, and thermal resistance. Moreover, there have been found no appropriate adhesives for bonding metal foils to films of some thermoplastic resins, such as polyethylene, polypropylene and the like, and therefore, it has been difficult to coat these resin films with metal foils. Therefore, the type and use of the composite has been limited.

As a result of extensive research conducted to overcome the above-said disadvantages of conventional methods for manufacturing insulating film, sheet, or plate materials overlaid with thin metallic film, the present inventors have developed a method for manufacturing an insulating film, sheet, or plate material having thereon a thin metallic coating, which comprises applying a new, special, physical technique to an insulating base material in the form of a film, sheet, or plate to form thereon a thin metallic coating with a high adherence to the base material.

According to the present invention, there is provided a film, sheet or plate material in which a metallic coating is formed on at least one surface of an insulating film, sheet or plate by the cluster ion plating method.

A detailed explanation of the present invention is made below referring to the accompanying drawings, in which FIG. 1 shows an example of the equipment used in this invention, and FIG. 2 also shows the ionized cluster vapor deposition chamber in FIG. 1.

In the drawings, 1 is a pay-off roll for film, 2 a wind-up roll for film, 3 an ionized cluster vapor deposition chamber, 4 an ionized cluster vapor generator, 5 an electrode for the base material, 6 a base material in the form of a film, 7 a crucible, 8 a crucible heater, 9 an ionizing electrode, 10 an ionizing heater, 11 an extraction-electrode, 12 the metal to be deposited. In FIG. 2, $A_1 - A_1'$, $A_2 - A_2'$, $B_1 - B_1'$, $B_2 - B_2'$ show that electrical connection has been established.

The cluster ion plating method referred to herein means the following method:

In an ionized cluster vapor deposition chamber 3 maintained at a vacuum of $1 \times 10^{-4}$ to $1 \times 10^{-7}$ Torr., a DC voltage of 0.1 to 10 kV is applied between a red-hot crucible heater 8 and a crucible 7 used as an anode and containing the metal to be deposited, thus causing a current of 0.1 to 10 A to flow to heat the crucible at a temperature of 200° C to 2,500° C. The temperature of the crucible is sufficiently high to give a vapor pressure high enough to form the metallic coating at a certain rate. The electric power consumed between the crucible and the crucible heater should be sufficient enough to maintain the vapor pressure needed. When the crucible temperature becomes higher, the vapor pressure inside the crucible is increased owing to the generation of metal vapor and is released as a jet through a small hole provided on the top of crucible. The metal vapor jet thus formed is quenched by adiabatic expansion owing to the pressure difference between outside and inside the crucible and loses in its kinetic energy in the directions other than that of jet, thus forming a cluster (an aggregate of atoms or molecules) due to the van der Waals force. For this purpose, the diameter of the small hole is 1 to 30%, preferably 5 to 20%, of the inner diameter of the crucible. When the diameter of the hole is near to the inner diameter of the crucible, the difference in pressure between the outside and the inside of the crucible is too small and the degree of cluster formation is too small. When the diameter of the hole is too small as compared with the inner diameter of the crucible, the rate of vapor deposition is too small.

The cluster thus formed is ionized by collision with electrons generated by applying a DC voltage between the red-hot ionizing heater 10 and the ionizing anode 9, then accelerated by the voltage applied between the ionizing anode 9 and an electrode 5 at the back of the base material as well as an extraction-electrode 11, and deposited on the base material 6. The ionization DC voltage applied between the ionizing heater and the ionizing anode is 10 to 1,000 V and the ionization electron-current may be 10 to 1,000 mA, and preferably 10 to 300 mA for thermoplastics. The voltage applied between the electrode 5 behind the base material and the ionizing anode 9 is 10 to 10,000 V, preferably 10 to 5,000 V, more preferably 10 to 3,000 V, for thermoplastic film. In the case of plastic base materials, too large an ionization electronic current or an accelerating extraction-voltage is undesirable, because of serious sputter effect on the metallic coating surface and because of elevation of temperature of the base material surface which tends to decrease the adherence of the deposited coating to the base material.

A strong adherence may be obtained when the number of ions impinging upon unit area of the base material corresponds to 0.1 to several $\mu A/cm^2$ in terms of current which will flow between a piece of metal plate of unit area in place of the plastic base film and the ground.

The insulating base film travels from a payoff roll 1 by way of several rolls to a wind-up roll 2. During the course of ionized cluster vapor deposition, the electrode 5 at the back of the base material is preferably cooled to prevent the film from temperature rise.

The electrode 5 may be in the form of a roll. This roll-form electrode is preferably cooled so that the temperature of the base material may not be elevated. It is preferable that the electrode 5 is in contact with the insulating base material. In the case of a rigid base material such as ceramics or a non-flexible base material having a large thickness, the base material must be placed on a travelling guide chain and moved together with the latter.

In the above-said technique, the reason for maintaining a high vacuum of $1 \times 10^{-4}$ to $1 \times 10^{-7}$ Torr. is to ensure for the metal cluster a mean free path larger than the distance between the crucible and the base material in the form of a film to obtain a high-quality metallic coating even when said distance is increased in order to reduce the radiant heat from the crucible. The generation of a metal vapor jet from a small hole provided on the top of a crucible permits formation of a metal cluster and, at the same time, has an advantage of keeping the space distribution of the metal vapor and the cluster within a narrow range to increase the proportion of metal arriving at the base material.

The reason for ionizing and accelerating the ejected metal vapor and metal clusters is to impart them an energy amounting to several tens to several thousands electron volts to anchor the metal atoms and clusters in the base film to obtain a strong adherence and to improve the crystallinity of the metallic coating by means of the kinetic energy of the clusters.

Several percent to several scores percent of the resulting metal cluster vapor is ionized. One cluster formed consists of about 1,000 atoms, and hence, it follows that considerably many atoms are accelerated. One cluster is ionized into a monovalent ion, and accordingly, many atoms can be accelerated by a little charge. This is advantageous for obtaining a high adherence between the insulating film, sheet or plate and the resulting metallic coating. When deposited on the base material, the cluster is divided into many smaller particles, and this phenomenon is considered to serve to enhance the crystallinity of the metallic coating. When a cluster is ionized in a divalent or higher valent ion, the electrostatic repulsive force become larger then the van der Waars force, whereby the ionized cluster is divided into monovalent clusters.

The metallic substances to be used for generating the metal vapor are those which have electric conductivity and whose vapor pressure becomes $1 \times 10^{-5}$ Torr. at a temperature of 2,500° C or lower. Examples of such metals are Al, Cu, Pb, Cr, Ni, Fe, and Au though the invention is not limited thereto. Metals which need too high temperatures to get sufficient vapor pressure are undesirable, because they require a high crucible temperature and there is a danger that the plastic base film is damaged by the radiant heat.

The cluster ion plating method is as mentioned in detail above.

The insulating film or sheet materials to be used as the base material may be made of plastics or ceramics. In the case of plastics, the melting point thereof is preferably 80° C or higher, as measured by means of a microscope provided with a heated stage, because the film temperature may reach about 60° C during the metal deposition depending upon the conditions for deposition. The dielectric strength of the base film is preferably 500 V or higher, as measured on a film, 50$\mu$ in thickness, according to the method of JIS C 2318-72. The water absorption of the film should be 5% or less, as measured after immersion in water at 20° C for 24 hours. A film material having a water absorption larger than 5% takes much time for degassing treatment before metal deposition and the complete degassing becomes difficult, resulting in insufficient adherence and unsatisfactory quality of the metallic coating. More particularly, a suitable material meeting the above-noted requirements may be selected from ceramics such as alumina, steatite, forsterite, beryllia glass and the like; thermoplastic resins such as polyester, polyimide, polypropylene, high-density and low-density polyethylene, polyethylene terephthalate, polycarbonate, polyvinyl chloride, polystyrene, and polyvinylidene fluoride; and thermosetting resins, such as epoxy resin, and phenol resin, containing reinforcements such as paper, cloth, and glass fabric. Of the films made of the materials listed above, those having a thermal shrinkage of 10% or less, as measured after treatment at 80° C for 2 hours, should be used, because if the shrinkage exceeds 10%, the film deforms excessively due to the thermal effect during metal deposition, resulting in deterioration of adherence and gloss.

Although the thickness of metallic coating may be freely varied, a suitable thickness for the purpose of this invention is in the range from several Angstroms to several tens of microns, depending upon the intended use.

The insulating film, sheet, or plate materials having thereon a thin metallic coating thus manufactured may be used in various fields including printed circuits base boards, printed circuits boards, capacitor films, various optical filters, reflectors, film heaters, electrostatic printing papers, discharge printing papers, catalysts in the film form, construction materials, heat insulating materials, lagging materials, decoration materials, packaging materials, etc.

As compared with conventional methods, the present method for manufacturing an insulating film, sheet, or plate material with thin metallic coating has many superior features. The characteristic features of the present method in comparison with the conventional vacuum deposition methods are enumerated below.

(1) Thin metallic coating with higher adherence may be formed on an insulating film, sheet, or plate material, the adherence being generally as high as 1.9 kg/cm or even higher as measured by peeling test, or 60 kg/cm$^2$ or even higher as measured by the method of lifting the metal film from the substrate (base material).

(2) A metallic coating having a high crystallinity and, hence, higher electric conductivity may be formed, becuase the coating is formed from the vaporized metal cluster imparted with a high kinetic energy in a high vacuum.

(3) The metal may be deposited in a higher yield, because since the metal vapor cluster is ejected from a crucible, the space distribution of the metal vapor cluster is kept within a narrow range and, accordingly, the proportion of the vaporized metal cluster arriving at the base material is larger.

(4) A thin metallic coating having a higher crystallinity and corrosion resistance may be formed.

(5) A thin metallic coating with better gloss may be formed, because of the higher density of the coating resulting from the high crystallinity.

The superior features of the present method as compared with the conventional method of metal cladding by use of an adhesive may be summarized as follows:

(1) A thin metal layer having a thickness as small as about 5μ or less may be formed, which has been impossible by the method employing an adhesive.

(2) A metallic coating more resistant to rupture caused by folding of the finished material may be formed.

(3) There is no such deterioration in electric characteristics, particularly in a high frequency range, and in thermal resistance as is generally observed when an adhesive is used.

(4) A thin metallic coating with high adherence may be formed on those thermoplastic film materials, such as polyethylene and polypropylene, which are difficult to bond to a metal foil by use of an adhesive.

As stated above, the present method for manufacturing an insulating film, sheet, or plate material having a thin metallic coating thereon has many desirable features and is an industrially valuable method with a high precision which is easily practicable.

The present insulating film or sheet material having a thin metallic coating thereon can be used as a printed circuit base board. A printed circuit board may be obtained from this base board by reproducing a reversed circuit pattern using a resist ink on the metallic coating of the base board by screen printing or photographic printing, and thereafter removing the metallic coating except for the circuit pattern by etching. Alternatively, a printed circuit board can be directly obtained by the cluster ion plating technique by placing a metal foil mask on the base film or sheet during the metal vapor deposition and thereafter removing the mask.

The printed circuit board obtained as mentioned above has the following advantages over the conventional one, in addition to the aforesaid features of the insulating film or sheet material bearing a metallic coating formed thereon by the cluster ion plating technique.

(1) Because the thickness of the metallic coating is small, a miniature circuit may be obtained with a high dimensional precision.

(2) The metallic coating is dense and, accordingly, the conductivity thereof is equivalent to that of the solid metal. Therefore, it is advantageous for designing a thin miniature circuit.

(3) The direct method for making printed circuits board enables the simplification of operational steps and the diminishing of public hazards.

When it is required to impart higher mechanical strengths to the metallic coating formed by the cluster ion plating technique on an insulating film, sheet, or plate material, or to obtain a printed circuit for use in a circuit of comparatively large current-carrying capacity, it becomes necessary to grow the metallic coating to a thickness of several tens of microns by use of the same metal. The growth can be effected by the cluster ion plating technique, or by a procedure similar to the cluster ion plating, except that in order to increase the rate of metal deposition, the diameter of the ejecting hole of the crucible is increased so that the cluster cannot be formed, or by other vapor deposition techniques such as vacuum deposition, sputtering, and ion plating by the plasma technique, or be electrolytic plating. Of these techniques, a suitable one should be selected according to the case where the metal coating is intended for use as an electric circuit, or where the greatest concern is productivity, or where the quality of the metal layer is a primary concern.

The invention is illustrated below in detail with reference to Examples, but the invention is not limited to these Examples.

EXAMPLE 1

Figure 2:
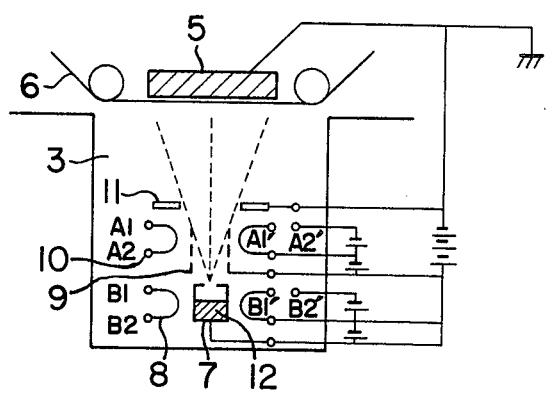

Copper was deposited from the vapor phase on a polyester film, 75μ in thickness, used as a base material, by means of the equipment shown in FIGS. 1 and 2. The crucible, 30 mm in inner diameter and 30 mm in height, was made of carbon and provided with a hole, 3 mm in diameter, at the center of the top. A copper coating, 3μ in thickness, was deposited under the conditions shown in Table 1.

Table 1

| | |
|---|---|
| Power supplied to crucible | 2 KW (2 KV × 1 A) |
| Power for ionization | 100 W (0.5 KV × 200 mA) |
| Extraction voltage | 1 KV |
| Number of crucibles | 2 |
| Travelling speed of film | 0.4 m/min. |

Table 2 shows performance characteristics of the flexible printed circuit base board prepared under the conditions shown in Table 1 and those of a conventional flexible printed circuit base board prepared as a Comparative Example by bonding a copper foil, 35μ in thickness, to a polyester film, 75μ in thickness, by use of an adhesive of the epoxy resin type under application of heat and pressure. The present flexible printed circuit base board was found to be a high-performance one, which was excellent in mechanical strengths, processability, and adherence.

Table 2

| | Example 1 | Comparative Example 1 (conventional base board) | Testing method |
|---|---|---|---|
| Folding endurance (number of folds) | 500 | 20 | JIS-P-8115 (number of folds before rupture of Cu foil) |
| Etching speed | 30 sec. | 5 min. | |
| ε(dielectric constant) after etching | 3.0 | 4.0 | JIS-C-6481 |
| Soldering resistance | Good | Good | JIS-C-6481 220° C, 60 sec. |
| Peel strength* | 1.2 kg/cm | 1.0 kg/cm | JIS-C-6481 |

Note: *Peel strength was evaluated by measuring the load per unit width of bond required to peel off the base film from the copper layer, the backside of which, copper layer, had been adhered to a rigid plate.

EXAMPLE 2

By using the same equipment and conditions as in Example 1, a copper coating, 7μ in thickness, was deposited from the vapor phase on a high-density polyethylene film, 50μ in thickness, used as the base film. The resulting flexible printed circuit base board showed a folding endurance of 200 (number of folds), an peel strength of 1.0 kg/cm, an etching speed of 30 sec., and ε (dielectric constant) after etching of 2.5. The board was quite suitable for the use where a high thermal resistance was not required. It has heretofore been impossible to manufacture a printed circuit base board by using as a base material a polyethylene film, for which there has been no suitable adhesive. It has now become possible, according to this invention, to provide a high-performance and low-cost flexible printed circuit base board.

EXAMPLE 3

Copper was deposited from the vapor phase on a polyester film, 75μ in thickness, used as a base material by means of the equipment of FIG. 2. The crucible, 30 mm in inner diameter and 30 mm in height, was made of carbon and provided with a hole, 3 mm in diameter, at the center of the top. A copper coating, 3μ in thickness, was deposited under the conditions shown in Table 3 to obtain a printed circuit board bearing a desired circuit pattern.

Table 3

| | |
|---|---|
| Power supplied to crucible | 2 KW (2 KV × 1 A) |
| Power for ionization | 100 W (0.5 KV × 200 mA) |
| Extraction voltage | 1 KV |
| Number of crucibles | 2 |
| Travelling speed of film | 0.4 m/min |
| Mask | 0.05 mm stainless-steel sheet |

A mask bearing a reverse pattern of the desired circuit, 50μ in circuit width, was prepared from a thin stainless-steel sheet, 0.05 mm in thickness, by etching. Vapor deposition was carried out while the mask held in close contact with the base film was travelling at the same speed as that of the base film.

Table 4 shows performance characteristics of the flexible printed circuit board prepared under the conditions shown in Table 3 and those of a conventional flexible printed circuit board made by etching from a conventional flexible printed circuit base board prepared, as a Comparative Example, by bonding a copper foil, 35μ in thickness, to a commercially available polyester film, 75μ in thickness, by use of an adhesive of the epoxy resin type under application of heat and pressure. The present flexible printed circuit board was found to be a high-performance one, which was excellent in mechanical strengths and adherence; and the present method was found to be a simple and convenient method without bringing about public hazards.

Table 4

| | Example 3 | Comparative Example 2 | Testing method |
|---|---|---|---|
| Folding endurance (number of folds) | 500 | 20 | JIS-P-8115 (number of folds before rupture of copper foil) |
| ε of circuit board | 3.0 | 4.0 | JIS-C-6481 |
| Soldering resistance | Good | Good | JIS-C-6481 (220° C, 60 sec.) |
| Peel strength* | 1.2 kg/cm | 1.0 kg/cm | JIS-C-6481 |

Note: *Peel strength was evaluated by measuring the load per unit width of bond required to peel off the base film from the copper layer, the backside of which, copper layer, had been adhered to a rigid plate.

EXAMPLE 4

By use of the same equipment and under the same conditions as in Example 3, a copper coating, 7 μ in thickness, was deposited from the vapor phase on a high-density polyethylene film, 50 μ in thickness, used as a base film, to obtain a printed circuit board bearing the desired circuit pattern. The thus obtained printed circuit board showed a folding endurance of 200, a peel strength of 1.0 kg/cm, and ε of 2.5. It was found to be a flexible printed circuit board suitable for the use where a high thermal resistance is not required.

It has heretofore been impossible to manufacture a printed circuit board by using as a base material a polyethylene film, for which there has been no suitable adhesive. It has now become possible, according to this invention, to provide a high-performance and low-cost flexible printed circuit board.

EXAMPLE 5

Copper was deposited from the vapor phase on a paper-base phenol resin laminate, 1.6 mm in thickness, used as a base material, by means of an equipment using guide chains. The crucible, 30 mm in inner diameter and 30 mm in height, was made of carbon and provided with a hole, 3 mm in diameter, at the center of the top. A copper coating, 5 μ in thickness, was deposited under the conditions shown in Table 5.

Table 5

| | |
|---|---|
| Power supplied to crucible | 2 KW (2 KV × 1 A) |
| Power for ionization | 100 W (0.5 KV × 200 mA) |
| Extraction-voltage | 1 KV |
| Number of crucibles | 2 |
| Travelling speed of base board | 0.4 m/min |

The thus prepared printed circuit base board had a uniform copper coating without pinhole, the peel strength being 1.2 kg/cm or higher. By using this base board, a printed circuit, 20 μ in minimum circuit width, could be prepared. The etching speed was 30 seconds at room temperature. No warp was observed on the printed circuit board thus prepared.

EXAMPLE 6

A copper coating, 2 μ in thickness, was applied to a glass-fabric-base epoxy resin laminate under the same conditions as in Example 5, and a circuit pattern was reproduced by etching. A set of three sheets of coated paper (prepared by impregnating a glass fabric base material with epoxy resin and then drying) was placed on each side of the said laminate used as middle layer, to form an assembly. A copper foil was placed on each side of the assembly and subjected to compression molding to obtain a three-layer printed circuit base board. Although a pressure lower than that used in a conventional method had been applied in the compression molding, the resulting three-layer printed circuit base board was of a good quality, no voids having been formed around the pattern on the middle layer. Owing to the low molding pressure, no warp was observed.

EXAMPLE 7

Copper was deposited from the vapor phase on a paper-base phenol resin laminate, 1.6 mm in thickness, used as base board by means of an equipment using guide chains. The crucible, 30 mm in inner diameter and 30 mm in height, was made of carbon and provided with a hole, 3 mm in diameter, at the center of the top. A copper coating, 5 μ in thickness, was deposited under the conditions shown in Table 6 on the base board covered with a stainless-steel mask to obtain a printed circuit board bearing a circuit of the desired pattern.

Table 6

| | |
|---|---|
| Power supplied to crucible | 2 KW (2 KV × 1 A) |
| Power for ionization | 100 W (0.5 KV × 200 mA) |

Table 6-continued

| | |
|---|---|
| Extraction-voltage | 1 KV |
| Number of crucibles | 2 |
| Travelling speed of base board | 0.4 m/min |
| Mask thickness | 0.05 mm stainless-steel sheet |

The thus prepared printed circuit board had a circuit of uniform copper coating without pinhole, the peel strength having been 1.2 kg/cm of higher. The minimum circuit width was 20 $\mu$, and no warp of the board was observed. This printed circuit board was also excellent in soldering resistance and chemical resistance and quite suitable for practical use.

EXAMPLE 8

By using a mask made of thin chromium sheet, 0.05 mm in thickness, and under the same conditions as in Example 7, a copper coating, 3 $\mu$ in thickness, was deposited from the vapor phase on a polyimide resin laminate to obtain a printed circuit board carrying an IC circuit, the minimum circuit width having been 20 $\mu$. This printed circuit board was a high-grade one having a high adherence, being excellent in soldering resistance, electric characteristics, and chemical resistance, and being quite free from warpage.

EXAMPLE 9

Gold was deposited from the vapor phase on an alumina plate, 1.0 mm in thickness, used as a base material by means of an equipment using guide chains. The crucible, 30 mm in inner diameter and 30 mm in height, was made of carbon and provided with a hole, 3 mm in diameter, at the center of the top. A gold coating, 1 $\mu$ in thickness, was obtained under the conditions shown in Table 7.

Table 7

| | |
|---|---|
| Power supplied to crucible | 2 KW (2 KV × 1 A) |
| Power for ionization | 100 W (0.5 KV × 200 mA) |
| Extraction-voltage | 3 KV |
| Temperature of base board | 300° C |
| Travelling speed of base board | 0.2 m/min |

The thus prepared printed circuit base board had a uniform gold coating without pinhole, the adherence thereof having been 60 kg/cm$^2$ or higher as measured by the method of lifting the metal layer from substrate. By using this base board, a circuit, 5 $\mu$ in minimum circuit width, could be made. The yield of gold deposition was about 70% or higher.

EXAMPLE 10

Under the same conditions as in Example 9, copper was deposited to a thickness of 2 $\mu$ on a steatite porcelain base board, 2.0 mm in thickness to obtain a uniform copper coating without pinhole, the adherence thereof having been 60 kg/cm$^2$ or higher as measured by the method of lifting the metal film from the substrate. A printed circuit, 10 $\mu$ in minimum circuit width, could be obtained from the said base board by printing a circuit pattern and then etching.

EXAMPLE 11

Gold was deposited from the vapor phase on an alumina plate, 1.0 mm in thickness, used as base board material by means of an equipment using guide chains. The crucible, 30 mm in inner diameter and 30 mm in height, was made of carbon and provided with a hole, 3 mm in diameter, at the center of the top. A gold coating, 1 $\mu$ in thickness, was deposited under the conditions shown in Table 8 on the base board covered with a stainless-steel mask to obtain a printed circuit board bearing a circuit of the desired pattern.

Table 8

| | |
|---|---|
| Power supplied to crucible | 2 KV (2 KV × 1 A) |
| Power for ionization | 100 W (0.5 KV × 200 mA) |
| Extraction voltage | 3 KV |
| Temperature of base board | 300° C |
| Travelling speed of base board | 0.2 m/min |
| Mask thickness | 0.02 mm stainless-steel sheet |

The thus prepared printed circuit board had a circuit of uniform gold coating without pinhole, the adherence thereof having been 60 kg/cm$^2$ or higher as measured by the method of lifting the metal film from the substrate. The minimum circuit width was 20 $\mu$. This printed circuit board was also excellent in soldering resistance and chemical resistance and quite suitable for practical use.

EXAMPLE 12

Under the same conditions as in Example 11, a copper coating, 2 $\mu$ in thickness, was applied to a steatite porcelain base board, 2.0 mm in thickness. In this case, a uniform copper coating without pinhole was also obtained, the adherence thereof having been 60 kg/cm$^2$ or higher as measured by the method of lifting the metal film from the substrate. The minimum circuit width was 20 $\mu$. The inter-circuit insulation resistance to low-voltage or high-voltage DC or AC and the soldering resistance were sufficient for practical use.

EXAMPLE 13

Aluminum was deposited from the vapor phase to a thickness of 1,000 A on a polyester film, 4 $\mu$ in thickness, used as a base board material. The conditions for the deposition were as shown in Table 9.

Table 9

| | |
|---|---|
| Crucible | 30 mm inner diameter, 30 mm height, made of carbon |
| Power supplied to crucible | 2 KW (2 KV × 1 A) |
| Power for ionization | 100 W (0.5 KV × 200 mA) |
| Extraction-voltage | 1 KV |
| Number of crucibles | 2 |
| Travelling speed of film | 5 m/min |

As compared with the conventional metallized film for capacitor obtained by vacuum deposition, the metallized film prepared under the conditions shown in Table 9 was superior in adherence of metallic coating, corrosion resistance, and folding endurance and, hence, most suitable for use in capacitors. For comparison, performance characteristics of these two types of metallized film are shown in Table 10.

Table 10

| | Vacuum deposition | The present method |
|---|---|---|
| Adherence* | 0.1 kg/cm$^2$ | 60 kg/cm$^2$ |
| Folding endurance** (number of folds) | 10 | >800 |
| Chemical resistance and corrosion resistance | Susceptible to acid attack | Not susceptible to acid attack |

Note: *Adherence was measured by the method of lifting the metal film from the substrate (base material).
**Number of folds before rupture of aluminum coating. The testing procedure was similar to that described in JIS P 8115.

EXAMPLE 14

Under conditions similar to those shown in Table 1 of Example 1, zinc was deposited from the vapor phase to a thickness of 500 A on a polyethylene terephthalate film, 6 $\mu$ in thickness, used as a base film. Since the deposited coating was free from pinhole and excellent in adherence, folding endurance, and chemical resistance, it was suitable for use as a metallized film for capacitor.

EXAMPLE 15

On a methacrylic resin plate, 3 mm in thickness, used as a base board material, aluminum was deposited first by the cluster ion beam technique and then by the conventional vacuum deposition technique to a total thickness of about 3 $\mu$. The conditions for the deposition were as shown in Tables 11 and 12.

Table 11.

| Conditions for deposition by cluster ion beam technique | |
|---|---|
| Crucible | Made of carbon |
| Power supplied to crucible | 2 KW (2 KV × 1 A) |
| Power for ionization | 100 W (0.5 KV × 200 mA) |
| Extraction-voltage | 1 KV |
| Duration of deposition | 3 min |
| Thickness of metal coating | 1500 A |

Table 12.

| Conditions for vacuum deposition | |
|---|---|
| Crucible | Made of carbon |
| Power supplied to crucible | 1.5 KW (1.5 KV × 1 A) |
| Duration of deposition | 3 min |
| Thickness of metal coating | 3 $\mu$m |

The coating thus formed on the methacrylic resin plate was pinhole-free, uniform, excellent in gloss, and favorable in adherence to the base board.

EXAMPLE 16

On a methacrylic resin plate, 3 mm in thickness, used as a base board material, aluminum was deposited first by the cluster ion beam technique and then by the ionized vapor-phase deposition technique to a total thickness of about 3 $\mu$. The conditions for the deposition were as shown in Tables 13 and 14.

Table 13.

| Conditions for deposition by cluster ion beam technique | |
|---|---|
| Crucible | Made of carbon |
| Power supplied to crucible | 2 KW (2 KV × 1 A) |
| Power for ionization | 100 W (0.5 KV × 200 mA) |
| Extraction-voltage | 1 KV |
| Duration of deposition | 3 min |
| Thickness of coating | 1500 A |

Table 14.

| Conditions for ionized vapor-phase deposition | |
|---|---|
| Crucible | Made of carbon |
| Power supplied to crucible | 1.5 KW (1.5 KV × 1 A) |
| Power for ionization | 30 W (0.3 KV × 100 mA) |
| Extraction-voltage | 0.5 KV |
| Duration of deposition | 3 min |
| Thickness of coating | 3 $\mu$m |

The coating thus deposited from the vapor phase on the methacrylic resin plate was pinhole-free, uniform, excellent in gloss, and favorable in adherence.

What is claimed is:

1. A coated material comprising an insulating substrate of polyester of polyimide having on at least one surface a metallic copper coating deposited from the vapor phase by cluster ion plating, said plating being obtained by
   (1) providing a small hole on the top of a crucible containing the copper to be deposited, the diameter of the hole being 1 to 30% of the inner diameter of the crucible,
   (2) heating the crucible under vacuum to a temperature at which said copper is sufficiently vaporized to eject the copper vapor from said small hole, thereby forming clusters each being an aggregate of about 1,000 metal atoms,
   (3) allowing electrons, generated from a red-hot ionizing heater separately provided by applying a DC voltage between the heater and an ionizing anode, to collide against the clusters, thereby ionizing some of the clusters, and
   (4) accelerating the ionized clusters by applying a DC voltage sufficiently high to increase adherence of the clusters to the substrate, said accelerating voltage being applied between the ionizing anode and an extraction-electrode, thereby depositing the accelerated ionized clusters together with un-ionized clusters on the insulating substrate.

2. The coated material according to claim 1, wherein the thickness of the metallic coating deposited by the cluster ion plating is increased further by vapordeposition or sputtering of a metal.

3. The coated material according to claim 2, wherein the metal for vapor-deposition or sputtering is the same as that of the metallic coating deposited by the cluster ion plating method.

4. The coated material according to claim 1, wherein the metallic coating constitutes a printed circuit obtained by etching the metallic coating to remove the unnecessary part thereof or directly obtained by a masking method during the deposition.

5. The coated material according to claim 4, wherein the thickness of the metallic coating constituting a printed circuit is increased further by vapordeposition or sputtering of a metal.

6. The coated material according to claim 5, wherein the metal for vapor deposition or sputtering is the same as that of the metallic coating.

7. A method for manufacturing a coated substrate which comprises depositing a metallic coating from the vapor phase on at least one surface of an insulating substrate by a cluster ion plating method comprising the steps of
   (1) providing a small hole on top of a crucible containing a metal to be plated, the diameter of the hole being 1 to 30% of the inner diameter of the crucible,
   (2) heating the crucible under a vacuum of 1 × 10$^{-4}$ to 1 × 10$^{-7}$ Torr to a temperature at which said metal is sufficiently vaporized to eject the metal vapor from said small hole, thereby forming clusters each being an aggregate of about 1,000 metal atoms, (3) applying a DC voltage of 10 to 1,000 V between a red-hot ionizing heater provided separately and an ionizing anode to cause an electron current of 10 mA to flow therebetween, thereby generating electrons and allowing the electrons to collide against the clusters to ionize some of the clusters, and (4) applying a DC voltage of 10 to 3,000 V between the ionizing anode and an extraction electrode to accelerate the ionized cluster so that the ion density on the insulating substrate becomes 0.1 $\mu$A/cm$^2$ to several mA/cm$^2$ to deposit the ionized clusters together with un-ionized clusters on the insulating substrate.

8. The method for manufacturing a coated substrate according to claim 7, wherein the thickness of the metallic coating is increased further by vapor deposition or sputtering of a metal.

9. The method for manufacturing a coated substrate according to claim 7, wherein the metallic coating constitutes a printed circuit obtained by etching the metallic coating to remove the unnecessary part thereof or directly obtained by a masking method, during the deposition.

10. The method for manufacturing a coated substrate according to claim 9, wherein the thickness of the metallic coating constituting the printed circuit is increased further by vapor deposition or sputtering a metal.

11. The method for manufacturing a coated substrate according to claim 7, wherein the substrate is a thermoplastic resin film having a melting point of 80° C or more, a dielectric breakdown voltage of 200 V or more per 50 $\mu$ in thickness, a water absorption of 5% or less after immersion in water at 20° C for 24 hrs, and a heat-shrinkage of 10% or less after treatment at 80° C for 2 hrs.

* * * * *

UNITED STATES PATENT AND TRADEMARK OFFICE
CERTIFICATE OF CORRECTION

PATENT NO. : 4,091,138
DATED : May 23, 1978
INVENTOR(S) : Toshinori TAKAGI, Tatsuichiro NISHIYAMA and Unosuke UCHIDA It is certified that error appears in the above-identified patent and that said Letters Patent are hereby corrected as shown below:

Claim 1, line 2, polyester or polyimide

Signed and Sealed this

Twenty-seventh Day of November 1979

[SEAL]

Attest:

RUTH C. MASON
Attesting Officer

LUTRELLE F. PARKER
Acting Commissioner of Patents and Trademarks